(12) United States Patent
Chen et al.

(10) Patent No.: US 10,718,048 B2
(45) Date of Patent: Jul. 21, 2020

(54) TARGET STRUCTURE OF PHYSICAL VAPOR DEPOSITION

(71) Applicant: Taiwan Semiconductor Manufacturing Co., Ltd., Hsin-Chu (TW)

(72) Inventors: Ping-Yuan Chen, Hsinchu (TW); Hung-Cheng Chen, Hsinchu (TW); Chih-Hsua Hsieh, Hsinchu (TW); Yu-Hsuan Wang, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 195 days.

(21) Appl. No.: 15/882,899

(22) Filed: Jan. 29, 2018

(65) Prior Publication Data

US 2019/0003037 A1     Jan. 3, 2019

Related U.S. Application Data

(60) Provisional application No. 62/527,156, filed on Jun. 30, 2017.

(51) Int. Cl.
*H01J 37/34* (2006.01)
*C23C 14/34* (2006.01)
*C23C 14/14* (2006.01)
*C23C 14/06* (2006.01)
*C23C 14/16* (2006.01)
*C23C 14/35* (2006.01)

(52) U.S. Cl.
CPC ...... *C23C 14/3464* (2013.01); *C23C 14/0641* (2013.01); *C23C 14/14* (2013.01); *C23C 14/165* (2013.01); *C23C 14/3407* (2013.01); *C23C 14/352* (2013.01); *H01J 37/3417* (2013.01); *H01J 37/3429* (2013.01); *H01J 37/3435* (2013.01)

(58) Field of Classification Search
CPC ... C23C 14/0641; C23C 14/14; C23C 14/165; C23C 14/3407; C23C 14/3464; C23C 14/352; C23C 14/505; H01J 37/3417; H01J 37/3429; H01J 37/3435
USPC .......................... 204/298.12, 298.13, 298.23
See application file for complete search history.

(56) References Cited

U.S. PATENT DOCUMENTS

| | | | | |
|---|---|---|---|---|
| RE32,849 E | * | 1/1989 | Wei ......................... | C23C 14/46 204/192.27 |
| 4,820,393 A | * | 4/1989 | Brat .................... | C23C 14/3414 204/192.15 |
| 5,322,606 A | * | 6/1994 | Eskandari .......... | B23K 26/0608 204/298.28 |
| 6,030,511 A | * | 2/2000 | Shinmura ............. | C23C 14/046 204/192.15 |
| 6,224,718 B1 | * | 5/2001 | Meyer ................. | C23C 14/3407 204/192.11 |

(Continued)

*Primary Examiner* — Rodney G McDonald
(74) *Attorney, Agent, or Firm* — Duane Morris LLP

(57) ABSTRACT

A sputtering target structure includes a body having a first side and an opposing second side. A first sputtering target is coupled to the first side of the body. The first sputtering target includes a first material. A second sputtering target is coupled to the second side of the body. The second sputtering target includes a second material. A rotation mechanism is coupled to the body and is configured to allow rotation of the body from a first orientation to a second orientation.

20 Claims, 7 Drawing Sheets

(56) References Cited

U.S. PATENT DOCUMENTS 8,052,852 B2 * 11/2011 Chu .................... C23C 14/3407
204/298.12
2003/0085122 A1 * 5/2003 Takahashi ........... C23C 14/3464
204/298.23

* cited by examiner

TARGET STRUCTURE OF PHYSICAL VAPOR DEPOSITION

CROSS-REFERENCE TO RELATED APPLICATION

This application claims benefit to U.S. Provisional Appl. Ser. No. 62/527,156, filed on Jun. 30, 2017, and entitled "PVD TARGET," which is incorporated by reference herein in its entirety.

BACKGROUND

Current physical vapor deposition (PVD) processes uses targets as the source of deposited materials. Depending on the process recipe, the target may be used to deposit one or more material at a time, for example, a metal and a compound containing the metal, in separate layers. However, disparate materials cannot be used by varying the process recipe. In order to deposit disparate materials, for example, AlCu and TiN, the workpiece must be transferred between different process chambers. In high temperature processing, the time and delay while transferring between chambers can affect material properties such as grain size and interfacial properties.

BRIEF DESCRIPTION OF THE FIGURES

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Figure 1:
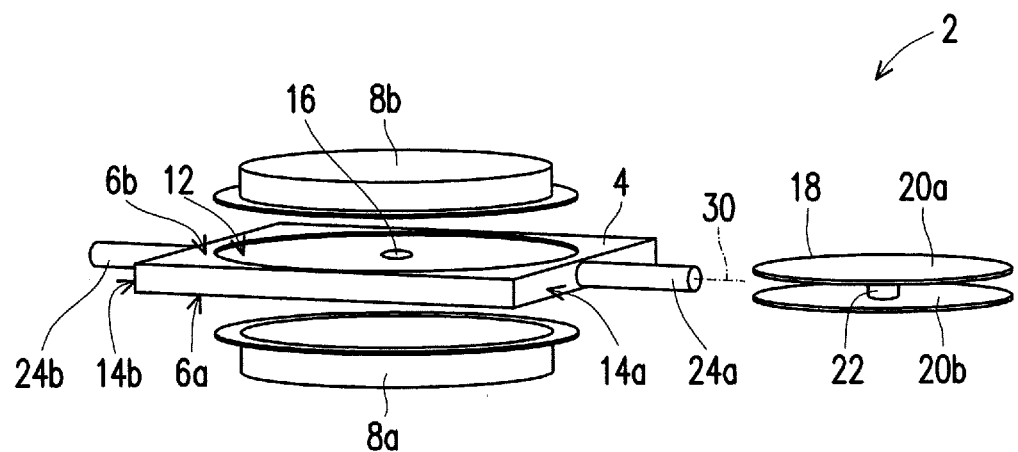
FIG. 1 illustrates a double-sided target including a firsts sputtering target and a second sputtering target, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a double-sided sputtering target is disclosed. The double-sided sputtering target includes a first sputtering target having a first material and a second sputtering target having a second material. The first material can include a titanium-based material, such as TiN and the second material can include an aluminum alloy, such as AlCu. The first sputtering target is coupled to a first side of the double-sided sputtering target and the second sputtering target is coupled to a second side of the double-sided sputtering target. The double-sided sputtering target is configured to be received within a deposition chamber and coupled to a rotation mechanism. The rotation mechanism is configured to rotate the double-sided sputtering target during an in-situ deposition process. For example, in some embodiments, the in-situ deposition process can include a first deposition phase and a second deposition phase. The rotation mechanism can rotate the double-sided sputtering target between the first deposition phase and the second deposition phase.

FIG. 1 illustrates a double-sided sputtering target structure 2, in accordance with some embodiments. The double-sided sputtering target structure 2 includes a rotation body 4. A first side 6a of the rotation body 4 is configured to couple to a first sputtering target 8a and a second side 6b of the rotation body 4 is configured to couple to a second sputtering target 8b. In some embodiments, each side 6a, 6b of the rotation body 4 has a recess 12 sized and configured to receive a sputtering target 8a, 8b therein. The recess 12 can include an inner perimeter configured to match an outer profile of a respective sputtering target 8a, 8b.

In various embodiments, the perimeter 14 of the rotation body 4 can be any suitable shape. For example, a suitable shape of the perimeter can include a square shape, a rounded shape, an oblong shape, and/or any other suitable shape. The shape of the perimeter 14 can be the same shape as or different from the shape of the sputtering targets 8a, 8b. For example, in the illustrated embodiment, the rotation body 4 defines a rectangular perimeter 14 and a circular recess 12 (corresponding to a circular perimeter of the sputtering targets 8a, 8b) although it will be appreciated that the rotation body 4 and/or the recess 12 can include any suitable geometric shape.

In some embodiments, the rotation body 4 defines at least one hole 16 extending from the first surface 6a of the body 4 to a second surface 6b of the body 4. The at least one hole 16 is sized and configured to receive a retention device 18 therein. For example, in some embodiments, the at least one hole 16 is sized and configured to receive a magnet, a post, and/or any other suitable retention device. The hole 16 can be positioned in a center of the rotation body 4 and extend into the recesses 12 defined by the body 4. In other embodiments, the at least one hole 16 can be positioned off-center and/or outside of the recesses 12. Although embodiments are illustrated including at least one hole 16, it will be appreciated that in some embodiments the at least one hole 16 can be omitted and alternative retention devices can be used.

In some embodiments, a retention device 18 is positioned through the at least one hole 16 to maintain the sputtering targets 8a, 8b in a fixed position within the respective recess 12. The retention device 18 can include a first magnetic plate 20a and a second magnetic plate 20b coupled between the rotation body 4 and the sputtering targets 8a, 8b. The first magnetic plate 20a and the second magnetic plate 20b can be coupled by a shaft 22 sized and configured to be inserted through the hole 16. The shaft 22 and the hole 16 center the magnetic plates 20a, 20b within the recesses 12 defined by the body 4. The magnetic plates 20a, 20b can include permanent magnets and/or electromagnets. Although magnetic plates 20a, 20b are illustrated, it will be appreciated that any suitable magnetic structure, such as concentric magnetic rings, concentrically disposed independent magnets, and/or any other suitable magnetic structures can be used and are within the scope of this disclosure. In some embodiments, the geometry of the magnetic plates 20a, 20b is complimentary to a geometry of the sputtering targets 8a, 8b. In some embodiments, the magnetic plates 20a, 20b can include an adhesive coating on at least one side configured to couple to a non-magnetic surface, such as a non-magnetic sputtering target and/or a non-magnetic rotation body 4.

In some embodiments, the first sputtering target 8a is coupled to a first side 6a of the rotation body 4 and the second sputtering target 8b is coupled to a second side 6b of the rotation body 4. The first and second sputtering targets 8a, 8b can have any suitable shape, such as a circular shape, a ring shape, and/or any other suitable shape. The sputtering targets 8a, 8b have a predetermined thickness configured to provide a predetermined amount of sputtering before needing to be replaced. In some embodiments, the first and second sputtering targets 8a, 8b include different materials. The materials of the sputtering targets 8a, 8b provide a source material to the surface of a substrate during a sputtering process. In some embodiments, the material of the sputtering target 8a, 8b is provided directly to the surface of the substrate. In other embodiments, the source material from the sputtering target 8a, 8b is combined with one or more additional materials, for example a gaseous material or plasma provided within a deposition chamber, to generate a deposited material.

In some embodiments, the first sputtering target 8a and/or the second sputtering target 8b can include one or more selected materials. For example, in some embodiments, the first and/or the second sputtering target 8a, 8b can include titanium (Ti), titanium nitride (TiN), an aluminum alloy, such as an aluminum copper alloy (AlCu), an aluminum (Al) alloy, a platinum (Pt) alloy, cobalt (Co), etc. In some embodiments, the first sputtering target 8a includes a first material, such as Ti, and the second sputtering target 8b includes a second material, such as AlCu, although it will be appreciated that other combinations are possible. The one or more materials can be selected to form a predetermined pattern and/or structure on a work-piece, as discussed in more detail below.

In some embodiments, the rotation body 4 includes one or more rotation mechanisms 24a, 24b. The rotation mechanisms 24a, 24b are configured to rotatably couple the rotation body 4 to a structure, such as the deposition chamber 100 discussed below with respect to FIG. 2. The one or more rotation mechanisms 24a, 24b can include a shaft 26 extending from one or more of the side walls 14a, 14b of the rotation body 4. In some embodiments, the rotation mechanisms 24a, 24b are aligned on a single rotational axis 30 extending through a center of the rotation body 4. Although embodiments are illustrated including rotation shafts 26, it will be appreciated that any suitable rotation mechanism can be used.

The double-sided sputtering target structure 2 is configured to be positioned within a deposition chamber, as discussed in more detail below. The rotation mechanisms 24a, 24b are configured to allow rotation of the rotation body 4 from a first orientation to a second orientation within the deposition chamber. In some embodiments, the first orientation includes the first sputtering target 8a in a down (or in-use) orientation and the second sputtering target 8b in an up (or non-use) orientation and the second orientation includes the second sputtering target 8b in the down orientation and the first sputtering target 8a in the up orientation. Although specific orientations and embodiments are discussed herein, it will be appreciated that the first orientation and/or the second orientation can position the first and second sputtering targets 8a, 8b in any suitable orientation such that the first and second sputtering targets 8a, 8b are segregated during a deposition process such that only a single sputtering target 8a, 8b (e.g., single source) is used during a deposition process.

Figure 2:
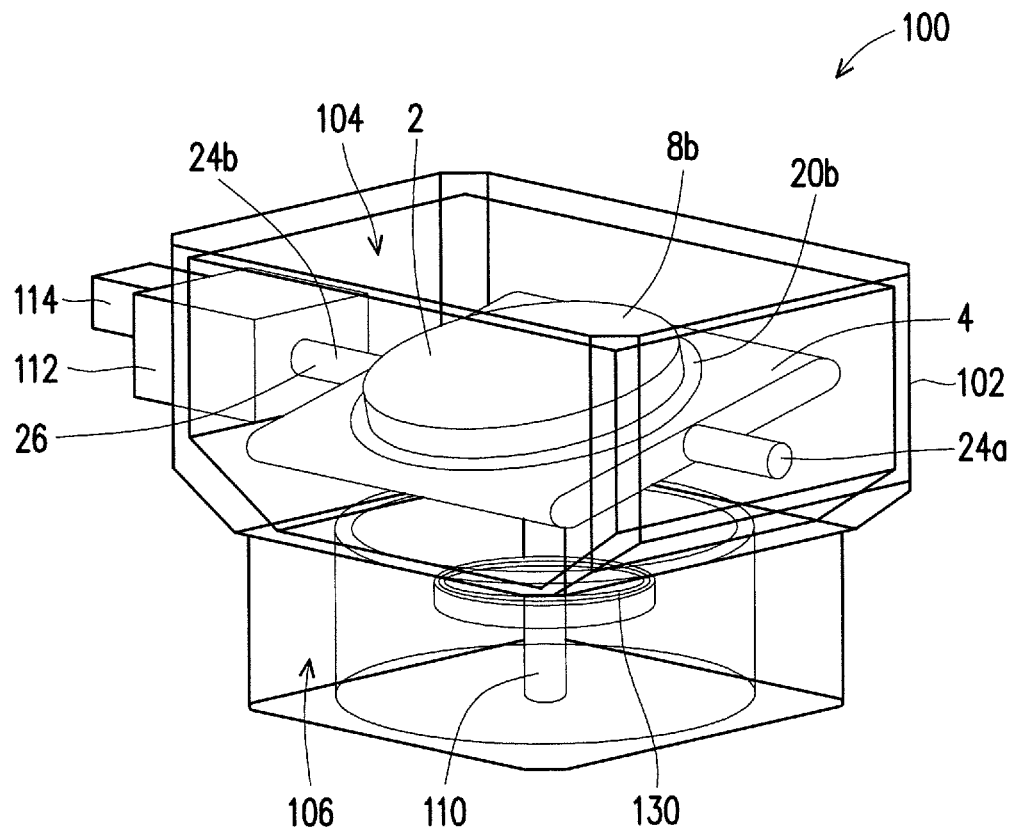
FIG. 2 illustrates a chamber for vacuum deposition using the double-sided target of FIG. 1, in accordance with some embodiments.

FIG. 2 illustrates a chamber 100 for PVD sputtering configured to receive the double-sided target structure 2, in accordance with some embodiments. The chamber 100 includes a chamber body 102 defining a target receiving area 104 and a work-piece receiving area 106. In some embodiments, the target receiving area 104 is disposed above the work-piece receiving area 106, although it will be appreciated that other orientations are possible. The target receiving area 104 is sized and configured to receive the double-sided target structure 2 therein. The work-piece receiving area 106 is sized and configured to receive a work-piece 130, such as a substrate therein. The work-piece 130 is configured to receive one or more layers of material through PVD sputtering.

In some embodiments, the double-sided target structure 2 is maintained within the target receiving area 104 by rotation mechanisms 24a, 24b. The rotation mechanisms 24a, 24b maintain the double-sided target structure 2 in a fixed longitudinal, horizontal, and vertical position within the receiving area 104 while allowing rotation of the double-sided target structure 2 along an axis of rotation. The chamber body 102 can include one or more rotation elements configured to interface with the rotation mechanisms 24a, 24b of the rotation body 4. For example, in the illustrated embodiment, the rotation mechanisms 24a, 24b include rotation shafts extending from the rotation body 4 through a portion of the chamber body 102 defining the receiving area 104. The chamber body 102 can include complimentary rotation elements, such as bushings, bearings, gears, etc. configured to couple the rotation mechanisms 24a, 24b to the chamber body 102. The complimentary rotation elements can be selected based on the rotation mechanism 24a, 24b of the double-sided sputtering target structure 2.

In some embodiments, the work-piece receiving area 106 includes a pedestal 110 sized and configured to receive a work-piece 130 thereon. The pedestal 110 positions the work-piece 130 at a predetermined distance from a selected one of the sputtering targets 8a, 8b positioned in an opposed facing relationship with the work-piece 130. For example, in some embodiments, the sputtering target 8a, 8b coupled to a down-facing side 6a of the body 4 is positioned in an opposed facing relationship with the work-piece 130. The pedestal 110 positions the work-piece 130 at a predetermined vertical distance from the selected one of the sputtering targets 8a, 8b.

In some embodiments, the double-sided target structure 2 is maintained in a predetermined vertical position with respect to the pedestal 110 such that the rotation body 4 can be rotated from a first orientation to a second orientation without contacting and/or otherwise interacting with a work-piece 130 positioned on the pedestal 110. In embodiments, the distance between the double-sided target structure 2 and the pedestal 110 can be adjustable, for example, by raising or lowering the double-sided target structure 2 and/or the pedestal 110 to provide sufficient clearance for rotation of the double-sided target structure 2. For example, in some embodiments, the pedestal 110 is vertically adjustable to a minimum spacing with respect to the double-sided target structure 2 substantially equal to half the width of the rotation body 4 plus the thickness of a work-piece placed on the pedestal 110, although it will be appreciated that a greater spacing is can be provided to allow additional clearance between the rotation body 4 and the work piece 130. The pedestal 110 can be vertically lowered to a bottom of the work-piece receiving area 106. A robotic arm (not shown) delivers a work-piece 130 into the work-piece receiving area 106. The pedestal 110 is raised to support the work-piece 130 and the robotic arm is withdrawn. The pedestal 110 can be additionally adjusted prior to and/or during a sputtering process. In other embodiments, the double-sided target structure 2 is removed from the target receiving area 104, rotated, and repositioned within the target receiving area 104. In some embodiments, the distance between the work-piece 130 and the double-sided target structure 2 is selected to optimize a PVD sputtering process and/or is adjustable during a sputtering process.

In some embodiments, a drive mechanism 112 is positioned to interface with one of the rotation mechanisms 24a, 24b of the double-sided target structure 2. The drive mechanism 112 is configured to rotate the double-sided target structure 2 from a first orientation to a second orientation. The drive mechanism 112 can include any suitable drive mechanism, such as a motor or other mechanical drive mechanism, a hand-drive mechanism such as a crank, and/or any other suitable mechanism. The drive mechanism 112 is coupled to an outer surface of the chamber body 102 and is configured to rotatably couple to the double-sided target structure 2. The drive mechanism 112 is isolated from the receiving area 104 by a wall of the chamber body 102 and/or one or more complimentary rotation elements.

In operation, the double-sided target structure 2 can be positioned with the first sputtering target 8a in an opposed relationship with the work-piece 130 to deposit a first material layer on the work-piece 130. After depositing the first material layer, the double-sided target structure 2 can be rotated to position the second sputtering target 8b in an opposed relationship with the work-piece 130. A second material layer is deposited over the first material layer. In other embodiments, the second material layer may be deposited prior to the first material layer (i.e., the first material layer is deposited over the second material layer). The first and second material layers are deposited in the same chamber 100 and are deposited without needing to open or interact with the interior of the chamber 100. In some embodiments, the first material layer and the second material layer are deposited without cleaning the deposition chamber 100 between material layers.

In some embodiments, the drive mechanism 112 is coupled to a controller 114 configured to control operation of the drive mechanism 112. The controller 114 can include any suitable controller, such as a microcontroller, field programmable gate-array, application specific integrated circuit (ASIC), programmable logic controller (PLC), and/or any other suitable controller. The controller 114 is configured to operate the drive mechanism 112 to rotate the double-sided target structure 2 in response to one or more predetermined process conditions, such as an elapsed time, a thickness of a deposited material, a predetermined deposition profile, and/or any other suitable process condition and/or user input. For example, in some embodiments, the controller 114 maintains the double-sided target structure 2 in a first orientation for a first predetermined time period. After the first predetermined time period has elapsed, the controller 114 is configured to activate the drive mechanism 112 to rotate the double-sided target structure 2 to a second orientation.

In some embodiments, the controller 114 is configured to rotate the double-sided target structure 2 in a predetermined pattern. For example, in some embodiments, the controller 114 is configured to maintain the double-sided target structure 2 in a first orientation having the first sputtering target 8a in an opposed relationship with the work-piece 130. The controller 114 maintains the first orientation for a first predetermined deposition period during which a PVD process deposits a predetermined thickness of the first material 8a on the work-piece 130. After the first predetermined deposition period, the controller 114 activates the drive mechanism 112 to rotate the double-sided target structure 2 to a second orientation having the second sputtering target 8b in an opposed relationship with the work-piece 130. The controller 114 maintains the double-sided target structure 2 in the second orientation for a second predetermined deposition period. After the second predetermined deposition period has elapsed, the controller 114 can be activated to rotate the double-sided target structure 2 back to the first orientation to allow for additional sputtering of the first material 8a. It will be appreciated that the controller 114 can be configured to rotate the double-sided target structure 2 any number of times to achieve a predetermined profile on the work-piece 130.

In comparison with other approaches, the double-sided targeting structure 2 provides for an in-situ deposition process that reduces manufacturing time and prevents particle contamination during deposition, thereby increasing reliability and improving product yield. For example, the double-sided targeting structure 2 and associated chamber 100 reduce the number of sputtering target transfers required for each deposition process and reduces the number of process tools required. In some instances, a single double-sided targeting structure 2 can be used to perform a complete deposition and replaces three or more sputtering target transfers in other approaches. The disclosed double-sided targeting structure 2 and associated chamber 100 further provide an improvement in cycle time as compared to other approaches. For example, in some embodiments, a cycle time improvement of up to 80% may be realized using the double-sided targeting structure 2.

Figure 3A:
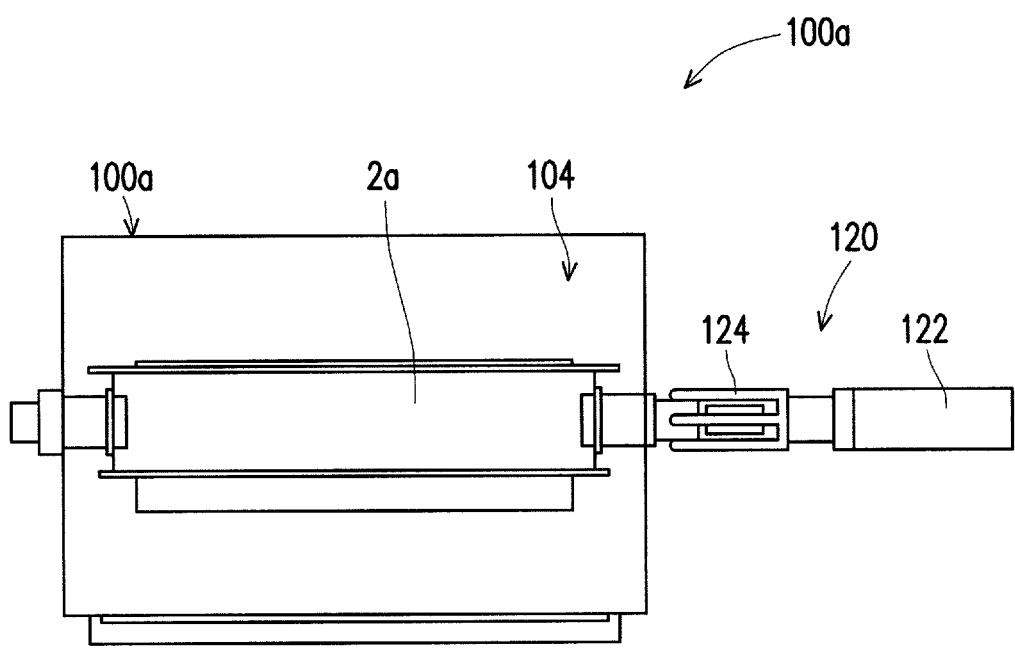
FIG. 3A illustrates a side view of a rotation mechanism for rotating the double-sided target of FIG. 1, in accordance with some embodiments.
Figure 3B:
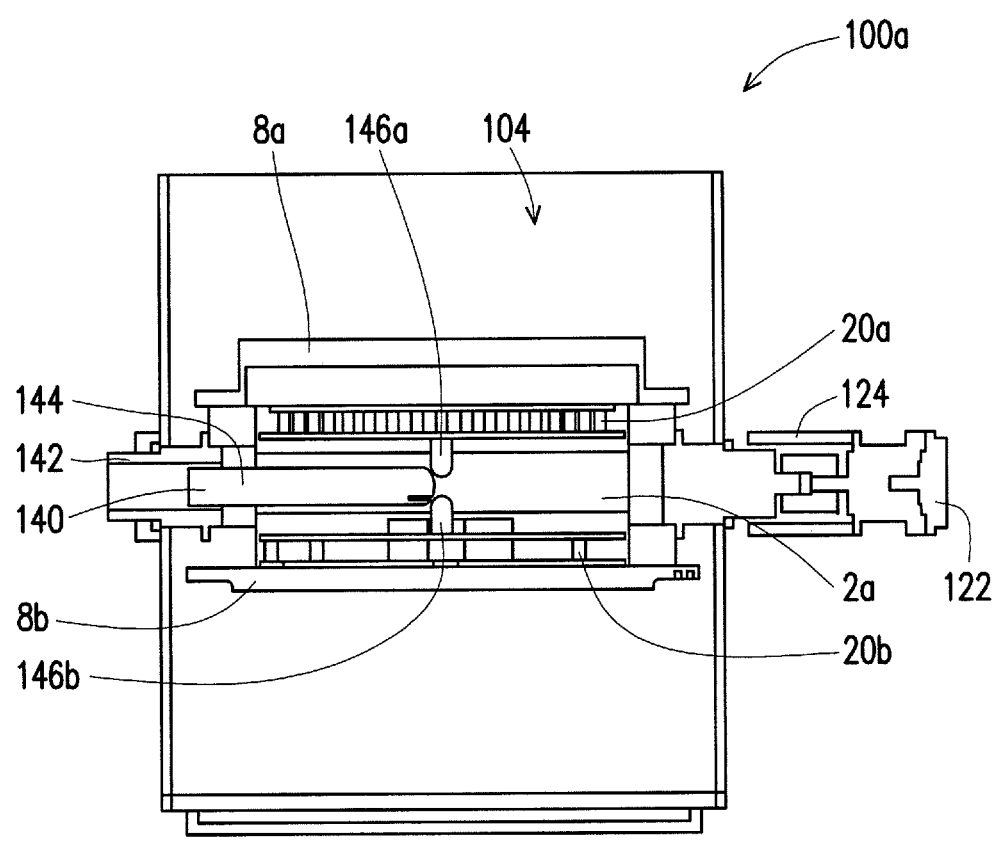
FIG. 3B illustrates a cross-sectional view of the rotation mechanism of FIG. 3A, in accordance with some embodiments.
Figure 3C:
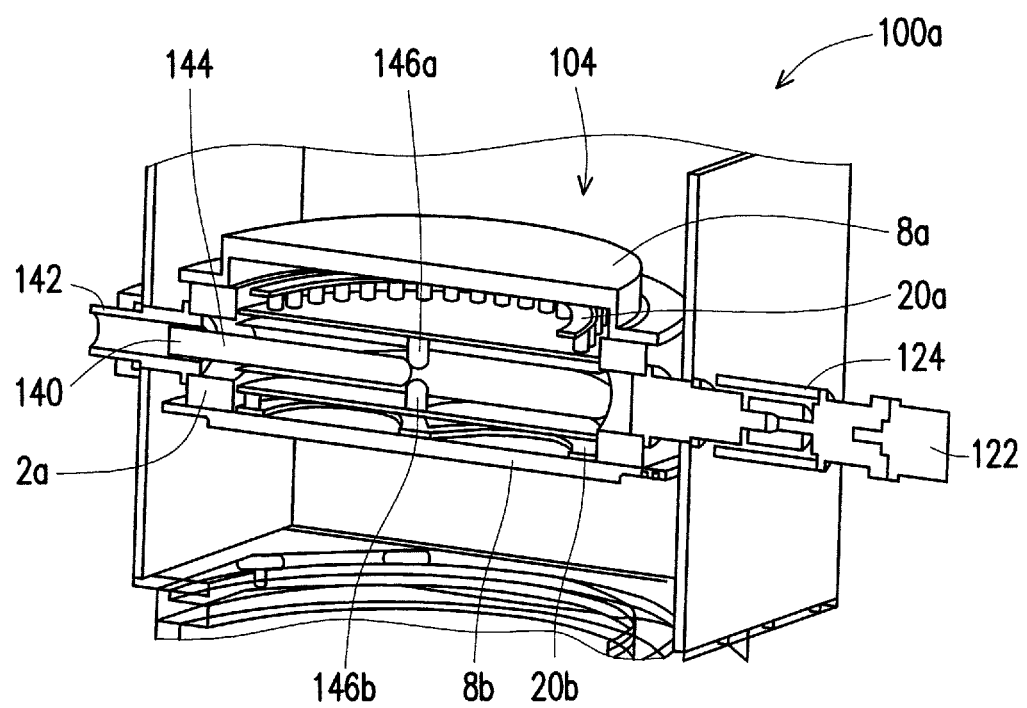
FIG. 3C illustrates a side elevation cross-sectional view of the rotation mechanism of FIG. 3A, in accordance with some embodiments.

FIGS. 3A-3C illustrate a double-sided target structure 2a positioned within the receiving area 104 of a deposition chamber 100a, in accordance with some embodiments. The double-sided target structure 2a and the deposition chamber 100a are respectively similar to the double-sided target structure 2 and deposition chamber 100 discussed above, and similar description is not repeated herein. A first rotation mechanism 24a of the double-sided target structure 2a is coupled to a rotation driver 120. The rotation driver 120 is configured to allow rotation of the rotatable body 4 of the double-sided target structure 2a from a first orientation to a second orientation. In some embodiments, the rotation driver 120 includes a driver 122 coupled to the rotation mechanism 24a by a coupling mechanism 124. The coupling mechanism 124 can include any suitable coupling mechanism configured to permanently and/or releaseably couple the handle 112 to the rotation mechanism 24a.

In some embodiments, the coupling mechanism 124 includes a servomotor coupling mechanism configured to couple the driver 122 to a servomotor (not shown) configured to control rotation of the double-sided target structure 2a. The coupling mechanism 124 can include one or more gears configured to couple to the servomotor. In some embodiments, the servomotor is configured to control rotation of the double-sided target structure 2a in accordance with one or more predetermined deposition patterns.

In some embodiments, the double-sided target structure 2a includes a planar rotation assembly 140 including a motor 142 and a gear rod 144. The planar rotation assembly 140 is configured to control planar rotation of the first magnet 20a and/or the second magnet 20b. Planar rotation of the magnets 20a, 20b results in planar rotation of the respective first material 8a and/or second material 8b coupled to the magnet 20a, 20b in a plane defined by a target surface of the material 8a, 8b. Planar rotation of the target materials 8a, 8b increases deposition uniformity during a deposition process. In some embodiments, the motor 142 is a step motor configured to rotate the gear rod 144 about a longitudinal axis. The gear rod 144 is coupled to rotation elements 146a, 146b coupled to respective first and second magnets 20a, 20b. Rotation of the gear rod 144 about a longitudinal axis is translated to planar rotation of the respective materials 8a, 8b. Although embodiments are illustrated herein having a motor 142 and a gear rod 144, it will be appreciated that any suitable planar rotation system can be configured to rotate the first material 8a and/or the second material during deposition.

Figure 4A:
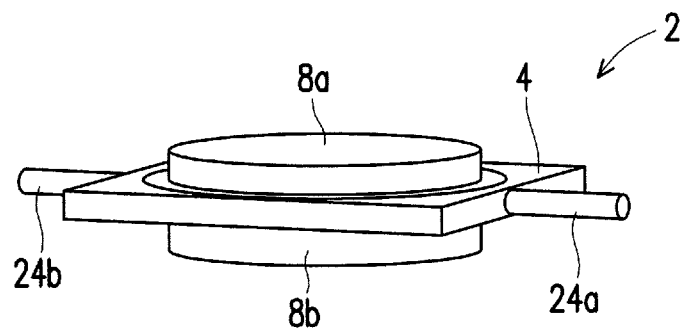
FIG. 4A illustrates a double-sided target in a first orientation having a first sputtering target positioned for a deposition process, in accordance with some embodiments.
Figure 4B:
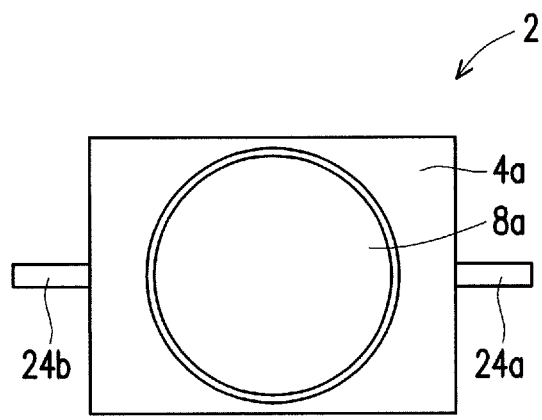
FIG. 4B illustrates the double-sided target of FIG. 4A in a partially-rotated position, in accordance with some embodiments.
Figure 4C:
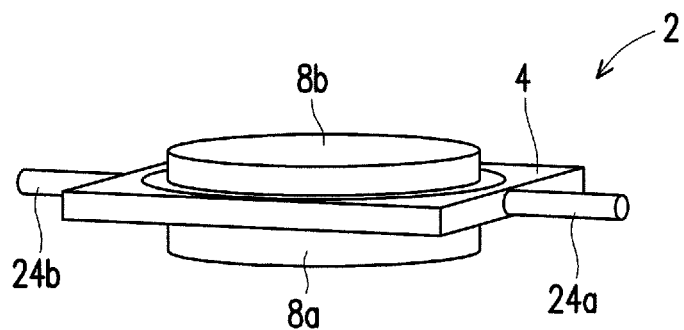
FIG. 4C illustrates the double-sided target of FIG. 4A in a second orientation having a second sputtering target positioned for a deposition process, in accordance with some embodiments.

FIGS. 4A-4C illustrate a double-sided target structure 2b in various rotational orientations, in accordance with some embodiments. FIG. 4A illustrates the double-sided target structure 2b in a first orientation having a first sputtering target 8a positioned for a deposition process, such as a PVD process. For example, in some embodiments, the first sputtering target 8a can be positioned in an opposed (or facing) orientation with a work-piece configured to have at least one material layer formed thereon during the deposition process, as discussed above with respect to FIG. 2. The first sputtering target 8a can include any suitable deposition material, such as, for example, titanium.

FIG. 4B illustrates the double-sided target structure 2b in a partially-rotated position. The double-sided target structure 2b includes a rounded rotation body 4a. The double-sided target structure 2b is rotated from the first orientation shown in FIG. 4A, through the partially-rotated position shown in FIG. 4B, and fully rotated to the second orientation shown in FIG. 4C. In the second orientation illustrated in FIG. 4C, a second sputtering target 8a is positioned in an opposed orientation with the work-piece. The second sputtering target 8a can include any suitable deposition material, such as, for example, an aluminum alloy (e.g., AlCu).

In some embodiments, each of the sputtering targets 8a, 8b can have a predetermined deposition topography configured for deposition of the respective deposition material. For example, as shown in FIGS. 4A & 4C, the sputtering targets 8a, 8b can include a plurality of peaks 50 and valleys 52 defining a predetermined deposition topography, although it will be appreciated that other topographical features can be added to the sputtering targets 8a, 8b to obtain a predetermined deposition topography.

Figure 5:
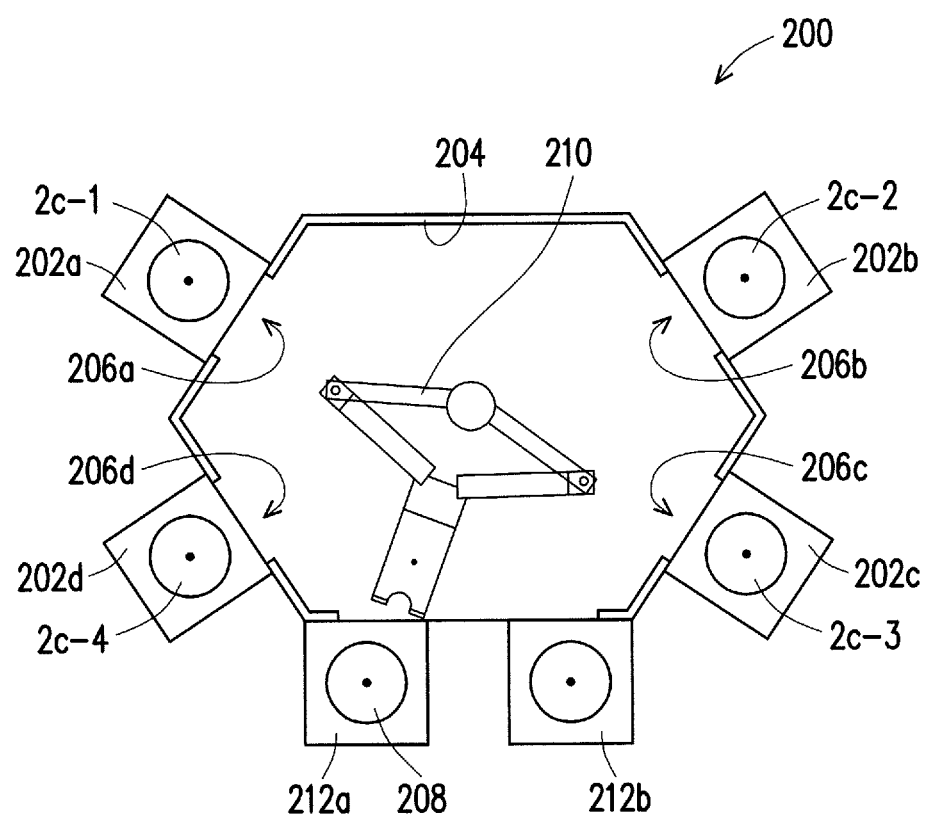
FIG. 5 illustrates a deposition system including a plurality of deposition chambers each having double-sided sputtering targets located therein, in accordance with some embodiments.

FIG. 5 illustrates a deposition system 200 including a plurality of deposition chambers 202a-202d each having double-sided sputtering targets 2c-1-2c-4 (collectively "double-sided sputtering targets 2c") located therein, in accordance with some embodiments. The plurality of deposition chambers 202a-202d are arranged concentrically about a frame 204 of the deposition system 200. Each of the deposition chambers 202a-202d are positioned at a respective opening 206a-206d in the frame 204. The openings 206a-206d are sized and configured to receive a work-piece 208a-208b therethrough.

In some embodiments, a pick-and-place mechanism 210 is positioned within the frame 204. The pick-and-place mechanism 210 is configured to retrieve a work-piece 208a, 208b from a first staging area 212a and place the work-piece in a predetermined position within a selected one of the plurality of deposition chambers 202a-202d. In some embodiments, the pick-and-place mechanism 210 is configured to place a work-piece 208a, 208b on a pedestal located within the deposition chamber 202a-202d (see FIG. 2).

Each of the deposition chambers 202a-202d include a double-sided sputtering target structure 2c therein. The double-sided sputtering targets 2c are similar to the double-sided sputtering targets 2, 2a, 2b discussed above, and similar description is not repeated herein. In some embodiments, each of the double-sided sputtering targets 2c are coupled to independent drive mechanisms configured to independently rotate a respective sputtering target structure 2c. When a work-piece 208a, 208b is inserted into a selected one of the deposition chambers 202a-202d, a deposition process is performed using the associated one of the sputtering targets 2c. For example, in some embodiments, a first material layer is formed on the work-piece 208 from a first side of the associated double-sided sputtering target structure 2c. After the first material is deposited, the associated sputtering target structure 2c is rotated, and a second material layer is deposited on the work piece 208 from a second side of the associated double-sided sputtering target structure 2c.

In some embodiments, the pick-and-place mechanism 210 is configured to remove a selected work-piece 208 from one of the deposition chambers 202a-202d after a deposition process has completed. For example, in some embodiments, the pick-and-place mechanism 210 is configured to retrieve a selected work-piece 208 from the selected one of the deposition chambers 202a-202d and move the work-piece 208 to a second staging area 212b. The pick-and-place mechanism 210 is operated by an independent controller and/or by a controller configured to operate one or more of the rotation mechanisms of the deposition chambers 202a-202d.

Figure 6:
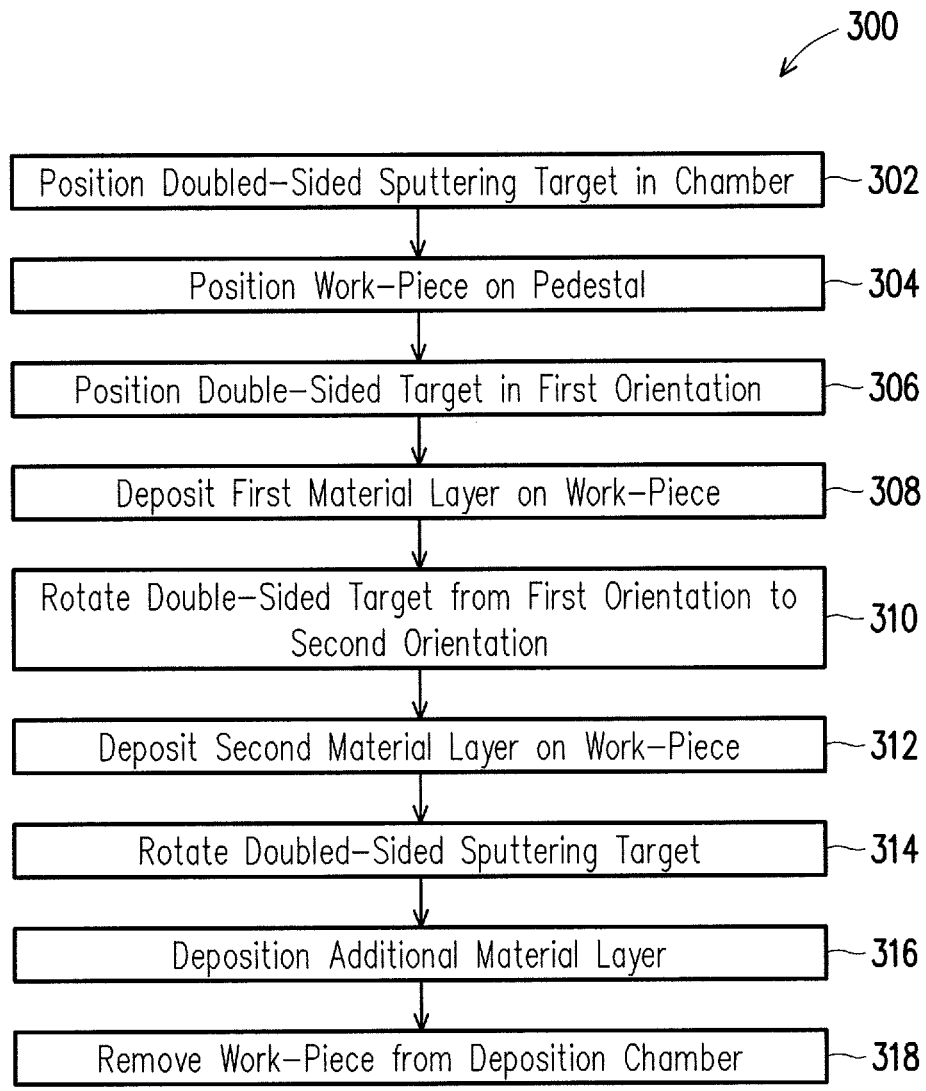
FIG. 6 is a flow chart illustrating a method of vacuum deposition using a double-sided target, in accordance with some embodiments.

FIG. 6 illustrates a method 300 of PVD deposition using a double-sided sputtering target, in accordance with some embodiments. At step 302, a double-sided sputtering target structure 2 is positioned within a deposition chamber 100. The double-sided sputtering target structure 2 includes a first sputtering target 8a coupled to a first side and a second sputtering target 8b coupled to a second side. Each of the first and second sputtering targets 8a, 8b include a selected deposition (or source) material. One or more rotation mechanisms 24a, 24b extend from the rotatable body 4 and interface with complimentary rotation elements formed in the deposition chamber 100.

At step 304, a work-piece 130 is positioned on a pedestal 110 within the deposition chamber 100. The work-piece 130 is configured to receive one or more material layers through a deposition process, such as a PVD process. In some embodiments, the work-piece 130 can be positioned by a pick-and-place mechanism 210.

At step 306, the double-sided sputtering target structure 2 is positioned in a first orientation. In the first orientation, the first sputtering target 8a is placed in an opposed (e.g., facing) relationship with the work-piece 130. The second sputtering target 8b is positioned away from, and segregated from, the work-piece 130 in the first orientation. In some embodiments, a face of the first sputtering target 8a substantially defines a first plane and a face of the work-piece 130 substantially defines a second plane. The first and second planes are parallel.

At step 308, a deposition process deposits a first material layer on the work-piece 130. The first material layer is formed by sputtering the first material from the first sputtering target 8a. In some embodiments, the deposition process deposits the first material layer to a predetermined thickness.

At step 310, the double-sided sputtering target structure 2 is rotated from the first orientation to a second orientation. The second orientation positions the second sputtering target 8b in an opposed (e.g., facing) arrangement with the work-piece 130. In some embodiments, the double-sided sputtering target structure 2 is rotated by a drive mechanism, such as a motor, coupled to one or more of the rotation mechanisms 24a, 24b of the double-sided sputtering target structure 2. In some embodiments, the double-sided sputtering target structure 2 is manually rotated by a manual rotation mechanism coupled to one of the rotation mechanisms 24a, 24b. The first sputtering target 8a is positioned away from, and segregated from, the work-piece 130 in the second orientation.

At step 312, a deposition process deposits a second material layer on the work-piece 130. The second material layer is formed by sputtering the second material from the second sputtering target 8b. In some embodiments, the deposition process deposits the second material layer to a predetermined thickness.

At optional step 314, the double-sided sputtering target structure 2 is rotated from the current orientation, e.g., the second orientation, to an opposite orientation, e.g., the first orientation. The double-sided sputtering target structure 2 can be rotated by any suitable mechanism, such as the drive mechanism and/or the manual rotation mechanism discussed above.

At optional step 316, a deposition process deposits an additional material layer on the work-piece 130. The additional material layer is formed by sputtering a material from a selected sputtering target 8a, 8b (i.e., a selected sputtering target positioned in an opposing relationship with the work-piece 130.) The method 300 can repeat steps 314 and 316 to deposit any number of additional layers from any combination of the first and second targets 8a, 8b.

At step 318, the work-piece 130 is removed from the deposition chamber 100. The work-piece 130 can be provided to additional chambers configured to deposit additional and/or alternative material layers, can be placed in a waiting area, and/or can be provided for additional processing. In some embodiments, the work-piece 130 is removed from the chamber 100 by a pick-and-place mechanism.

In various embodiments, a sputtering target structure is disclosed. The sputtering target structure includes a body having a first side and an opposing second side. A first sputtering target is coupled to the first side of the body. The first sputtering target includes a first material. A second sputtering target is coupled to the second side of the body. The second sputtering target includes a second material. A rotation mechanism is coupled to the body and is configured to rotate the body.

In various embodiments, a system is disclosed. The system includes a deposition chamber having a target receiving area and a work-piece receiving area. A double-sided sputtering target structure is positioned within the target receiving area. The double-sided sputtering target structure includes a body having a first side and an opposing second side. A first sputtering target is coupled to the first side of the body. The first sputtering target includes a first material. A second sputtering target is coupled to the second side of the body. The second sputtering target includes a second material. A rotation mechanism is configured to rotatably couple the double-sided sputtering target structure within the deposition chamber. The rotation mechanism is configured to rotate the double-sided sputtering target structure.

In various embodiments, a method of sputtering is disclosed. The method includes disposing a double-sided sputtering target structure in a deposition chamber. The double-sided sputtering target structure includes a body extending between a first side and an opposing second side, a first sputtering target coupled to the first side of the body, and a second sputtering target coupled to the second side of the body. The first sputtering target includes a first material and the second sputtering target includes a second material. A work-piece is positioned in the deposition chamber. The work-piece is positioned in an opposed facing relationship with the first sputtering target. A first material layer is formed on the work-piece by sputtering material from the first sputtering target. The double-sided sputtering target structure is rotated to position the second sputtering target in the opposed facing relationship with the work-piece. A second material layer is formed on the work-piece by sputtering material from the second sputtering target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A target structure, comprising:
   a body having a first side and an opposing second side, wherein the body includes a hole extending from the first side to the second side, and wherein each of the first side and the second side define a recess;
   a first sputtering target coupled to the first side of the body, the first sputtering target comprising a first material, wherein the first sputtering target is positioned partially within the recess defined by the first side;

a second sputtering target coupled to the second side of the body, the second sputtering target comprising a second material, wherein the second sputtering target is positioned partially within the recess defined by the second side;

a retention device comprising a first magnetic plate and a second magnetic plate coupled by a shaft, wherein the shaft is sized and configured to be inserted through the hole in the body, wherein the first magnetic plate is sized and configured to be positioned within the recess defined by the first side of the body and the second magnetic plate is sized and configured to be positioned within the recess defined by the second side of the body, and wherein the first magnetic plate maintains the first sputtering target in a fixed position with respect to the recess defined by the first side of the body and the second magnetic plate maintains the second sputtering target in a fixed position with respect to the recess defined by the second side of the body; and a rotation mechanism coupled to the body, the rotation mechanism configured to rotate the body.

2. The target structure of claim 1, wherein the first and second sputtering targets are magnetically coupled to the first and second magnetic plates.

3. The target structure of claim 1, wherein the first material and the second material are different materials.

4. The target structure of claim 1, wherein the first material comprises titanium nitride.

5. The target structure of claim 1, wherein the second material comprises an aluminum copper alloy.

6. The target structure of claim 1, wherein the rotation mechanism comprises at least one rotation shaft extending from the body.

7. The target structure of claim 6, wherein the at least one rotation shaft comprises a first rotation shaft and a second rotation shaft aligned on a longitudinal axis extending through a center of the body.

8. The target structure of claim 1, wherein each of the first side and the second side of the body include a recess sized and configured to respectively receive the first and second sputtering targets therein.

9. A physical vapor deposition (PVD) system, comprising:
a deposition chamber having a target receiving area and a work-piece receiving area; and
a double-sided sputtering target structure positioned within the target receiving area, the double-sided sputtering target structure comprising:
a body having a first side and an opposing second side, wherein the body includes a hole extending from the first side to the second side, and wherein each of the first side and the second side define a recess;
a first sputtering target coupled to the first side of the body, the first sputtering target comprising a first material, wherein the first sputtering target is positioned partially within the recess defined by the first side;
a second sputtering target coupled to the second side of the body, the second sputtering target comprising a second material, wherein the second sputtering target is positioned partially within the recess defined by the second side;
a retention device comprising a first magnetic plate and a second magnetic plate coupled by a shaft, wherein the shaft is sized and configured to be inserted through the hole in the body, wherein the first magnetic plate is sized and configured to be positioned within the recess defined by the first side of the body and the second magnetic plate is sized and configured to be positioned within the recess defined by the second side of the body, and wherein the first magnetic plate maintains the first sputtering target in a fixed position with respect to the recess defined by the first side of the body and the second magnetic plate maintains the second sputtering target in a fixed position with respect to the recess defined by the second side of the body; and a rotation mechanism configured to rotatably couple to the double-sided sputtering target structure within the deposition chamber, the rotation mechanism configured to rotate the double-sided sputtering target structure.

10. The PVD system of claim 9, wherein the rotation mechanism comprises at least one rotation shaft extending from the body of the double-sided sputtering target structure and extending through a side wall of the deposition chamber.

11. The PVD system of claim 9, further comprising a drive mechanism coupled to the rotation mechanism, wherein the drive mechanism is configured to rotate the double-sided sputtering target structure from the first orientation to the second orientation.

12. The PVD system of claim 11, wherein the drive mechanism comprises a motor.

13. The PVD system of claim 9, wherein the first and second sputtering targets are magnetically coupled to the first and second magnetic plates.

14. The PVD system of claim 9, wherein the first and second materials are different materials.

15. The PVD system of claim 14, wherein the first material comprises titanium nitride and the second material comprises aluminum copper.

16. A method of sputtering, comprising:
disposing a double-sided sputtering target structure in a deposition chamber, wherein the double-sided sputtering target structure comprises:
a body extending between a first side and an opposing second side and including a hole extending from the first side to the second side, wherein each of the first side and the second side define a recess,
a first sputtering target coupled to the first side of the body, wherein the first sputtering target is positioned partially within the recess defined by the first side,
a second sputtering target coupled to the second side of the body, wherein the second sputtering target is positioned partially within the recess defined by the second side, and wherein the first sputtering target comprises a first material and the second sputtering target comprises a second material, and
a retention device comprising a first magnetic plate and a second magnetic plate coupled by a shaft, wherein the shaft is sized and configured to be inserted through the hole in the body, wherein the first magnetic plate is sized and configured to be positioned within the recess defined by the first side of the body and the second magnetic plate is sized and configured to be positioned within the recess defined by the second side of the body, and wherein the first magnetic plate maintains the first sputtering target in a fixed position with respect to the recess defined by the first side of the body and the second magnetic plate maintains the second sputtering target in a fixed position with respect to the recess defined by the second side of the body;

positioning a work-piece in the deposition chamber, wherein the work-piece is positioned in an opposed facing relationship with the first sputtering target;

forming a first material layer on the work-piece by sputtering material from the first sputtering target;

rotating the double-sided sputtering target structure to position the second sputtering target in the opposed facing relationship with the work-piece; and forming a second material layer on the work-piece by sputtering material from the second sputtering target.

17. The method of claim 16, wherein the first material layer is formed over the second material layer.

18. The method of claim 17, wherein the first material layer and the second material layer are each formed with the work-piece in the deposition chamber.

19. The method of claim 17, comprising:

rotating the double-sided sputtering target to re-position the first sputtering target in the opposed facing relationship with the work-piece; and forming a third material layer above the second material layer on the work-piece by sputtering material from the first sputtering target.

20. The method of claim 16, wherein the deposition chamber is not cleaned between forming the first material layer and forming the second material layer.

* * * * *